United States Patent [19]

Uetani

[11] Patent Number: 5,876,904
[45] Date of Patent: Mar. 2, 1999

[54] METHOD OF PROVIDING A POSITIVE RESIST PATTERN

[75] Inventor: Yasunori Uetani, Toyonaka, Japan

[73] Assignee: Sumitomo Chemical Company, Ltd., Osaka, Japan

[21] Appl. No.: 782,642

[22] Filed: Jan. 14, 1997

[30] Foreign Application Priority Data

Jan. 16, 1996 [JP] Japan ..................................... 8-004601
Mar. 26, 1996 [JP] Japan ..................................... 8-069825
Jul. 2, 1996 [JP] Japan ..................................... 8-172021

[51] Int. Cl.$^6$ ..................................................... G03C 5/00
[52] U.S. Cl. .......................... 430/326; 430/328; 430/394
[58] Field of Search ..................................... 430/296, 325, 430/326, 328, 942, 966, 394

[56] References Cited

U.S. PATENT DOCUMENTS

| | | | |
|---|---|---|---|
| 4,377,633 | 3/1983 | Abrahamovich et al. | 430/312 |
| 4,444,869 | 4/1984 | Chonan et al. | 430/325 |
| 4,618,564 | 10/1986 | Demmer et al. | 430/270 |
| 5,206,117 | 4/1993 | Labadie et al. | 430/325 |

FOREIGN PATENT DOCUMENTS 7199483A 8/1995 Japan .

OTHER PUBLICATIONS

Lamola et al. Chemically Amplified Resists, Solid State Technology, Aug. 1991, pp. 53–59.
(Text of Paper) Yamamoto et al., "Investigation of Post Exposure Delay Effect on Positive Type Chemical Amplification EB Resists," 30p–MB–4.
(Text of Paper) Usujima et al., "Influence of Surfactant in Resist on Pattern," 27p–ZW–7.
(Text of Paper) Hirano et al., "Micro Bubble Defect Reduction on Photolithography," 27P–ZW–9.

*Primary Examiner*—Janet Baxter
*Assistant Examiner*—Rosemary Ashton
*Attorney, Agent, or Firm*—Birch, Stewart, Kolasch & Birch, LLP

[57] ABSTRACT

A method of forming a positive resist pattern comprising the steps of: (A) forming a positive resist film on a substrate; (B) irradiating the resist film with an active ray for patterning; (C) exposing the whole surface of the resist film to a light beam with a predetermined light exposure amount that causes substantially no film thickness reduction after development, the light beam being absorbed by the resist film and different from the active ray used for patterning; and (D) carrying out development after the irradiation for patterning and the exposure of the whole surface, which method forms a positive resist pattern, while depressing formation of a surface inhibition layer of the resist film and improving the affinity of the surface of the resist film to a developer, thereby improving the performance of the resist.

6 Claims, No Drawings

METHOD OF PROVIDING A POSITIVE RESIST PATTERN

BACKGROUND OF THE INVENTION

1. Field of the Invention

The present invention relates to a method of forming a positive resist pattern in the process of manufacture of semiconductors.

2. Description of the Prior Art

A positive resist pattern is generally formed according to the following manner. Firstly a positive resist is coated on a substrate such as a silicon wafer to form a resist film, then the resist film is irradiated with an active ray such as a light beam or an X ray through a mask or otherwise irradiated with a scanning active ray such as an electron beam or an ion beam, followed by an alkali development by taking advantage of an increase in solubility of the irradiated portion in an alkali, so as to remove only the irradiated portion and give a final pattern.

This known method of forming a resist pattern may cause occurrence of a surface inhibition layer of the resist film, which may adversely affect the resolution of the resist. In a positive resist comprising a quinone diazide type photosensitizer and a novolak resin, for example, when the resist film is thin or the substrate has a high reflection factor and particularly when a post-exposure bake is accompanied, the surface inhibition layer decreases the resolution. In a chemically amplified positive resist using a photo acid precursor, amine existing in the air deactivates the acid and forms the surface inhibition layer. As is well known, this results in decreasing the resolution, varying the performance of the resist remarkably depending on the time period between the exposure and the post-exposure bake, which is generally referred to as the time-delay effect, and causing a T-shaped profile in which only the surface portion is spread out.

Defects in the pattern after alkali development also sometimes occur. It is generally considered that such defective development is caused by air bubbles produced when a developer is applied onto the resist film and by microbubbles due to the gas dissolved in the developer. It is said that the smaller contact angle of the developer on the surface of the resist leads to the less defects of development (the Proceedings of the 43rd Applied Physics Joint Conference, 1996 Spring-Term, 27p-ZW-7 and 27p-ZW-9).

DETAILED DESCRIPTION OF THE INVENTION

One object of the present invention is thus to interfere with the phenomenon of forming the surface inhibition layer of the resist film, thereby solving the various problems due to this phenomenon, that is, the decreasing resolution, the worsened profile, and the time-delay effect.

Another object of the present invention is to improve the affinity of the surface of the resist film to the developer so as to interfere with the occurrence of micro-bubbles, thereby lessening the defects of development.

The inventors of the present invention have conducted extensive studies to attain the above objects and, as a result, completed the present invention.

The present invention provides a method of forming a resist pattern which comprises steps of:

(A) forming a positive resist film on a substrate;

(B) irradiating the resist film with an active ray for patterning;

(C) exposing the whole surface of the resist film to a light beam with a predetermined light exposure amount that causes substantially no film thickness reduction after development, the light beam being absorbed by the resist film and different from the active ray used in step (B); and (D) carrying out development after the step (B) and (C) are conducted.

In the present invention, a known procedure is applied to form a positive resist film on a substrate and to irradiate the resist film with an active ray for patterning. In the positive resist usable in the present invention, the portion irradiated with the active ray is soluble in a developer and removed by the process of development, whereas the non-irradiated portion remains as a pattern. Examples of the available positive resist include:

quinone diazide-type positive resists which comprise a quinone diazide compound such as a quinone diazide solfonate of a phenolic hydroxy group-containing compound or an aromatic amide of quinone diazide sulfonic acid, as a photosensitizer, and an alkali-soluble resin such as a novolak resin; and chemically amplified positive resists which comprise an alkali-soluble resin having a group eliminatable by the action of an acid and an acid precursor and may further contain additives such as a dissolution inhibitor and a sensitizer. Generally, a resist solution is prepared by dissolving the above mentioned components in an organic solvent, thereafter, the resist solution thus prepared is applied onto a substrate such as a silicon wafer, followed by drying the applied resist solution so as to form a resist film. Patterning is implemented by irradiating the resist film thus formed with a radiation, such as a near or middle ultraviolet ray, a far ultraviolet ray, or an X ray through a mask having a predetermined pattern or by scanning a beam such as an electron beam or an ion beam.

In addition to the above-mentioned conventional step of irradiation for patterning, the method of the present invention has a step of exposing the whole surface of the resist film to a light beam with a light exposure amount that causes substantially no film thickness reduction after development. This step allows the light beam to act only on the surface portion of the resist film, thereby solving the problems of the surface inhibition layer and generation of micro-bubbles. The light beam used for exposing the whole surface of the resist film needs to be different from the active ray used for patterning and need to be absorbed by the resist film.

In case that a light beam like an ultraviolet ray is used for patterning, the absorbance of the resist film to the light beam used for the exposure of the whole surface need to be higher than the absorbance of the resist film to the light beam used for patterning. For example, when a g-ray or i-ray resist comprising a quinone diazide type photosensitizer is used, a light beam having a wave length of not higher than 300 nm needs to be used for the exposure of the whole surface, since the absorbance of the resist film to the light beam having a wave length of not higher than 300 nm is higher than that of a g-ray or i-ray. Examples of an available light source of the light include a 254 nm line of a mercury lamp, a 248 nm KrF excimer laser beam, a 222 nm KrCl excimer lamp, a 193 nm ArF excimer laser beam, a 172 nm $Xe_2$ excimer lamp, a 146 nm $Kr_2$ excimer lamp, a 126 nm $Ar_2$ excimer lamp, and a deuterium lamp. When a chemically amplified resist to be exposed to an KrF excimer laser beam for patterning is used, a light beam having a wave length of not higher than 230 nm need to be used for the exposure of the whole surface. Examples of an available light source for the light include a 222 nm KrCl excimer lamp, a 193 nm ArF excimer laser beam, a 185 nm line of a mercury lamp, a 172 nm $Xe_2$ excimer lamp, a 146 nm $Kr_2$ excimer lamp, a 126 nm $Ar_2$ excimer lamp, a deuterium lamp, a far ultraviolet ray filtered by an interference filter to have a maximum absorption (λmax) of not higher than 230 nm. When a chemically amplified resist to be exposed to an ArF excimer laser beam is used, the light source for the exposure of the whole surface is selected, for example, from a light beam having a wave length of not higher than 185 nm, considering the absorbance of the resin. Examples of the available light source include a 185 nm line of a mercury lamp, a 172 nm $Xe_2$ excimer lamp, a 146 nm $Kr_2$ excimer lamp, a 126 nm $Ar_2$ excimer lamp, and a deuterium lamp.

On the other hand, in case that a scanning ray such as an electron beam or an electromagnetic wave of ultra-short wave length such as an X ray is used for patterning, any light beam that is absorbed by the resist film may be used for the exposure of the whole surface. Therefore, any of the above-mentioned examples for the light source for the exposure of the whole surface can be used in this case.

It is preferable that the light beam used for the exposure of the whole surface causes an absorbance of not lower than 1.5, more preferably not lower than 2, per 1 μm in thickness of the resist film. According to the experiment, a 0.4 μm-thick resist film obtained from "Sumi-Resist PF1-38" manufactured by SUMITOMO CHEMICAL CO., LTD., which is a positive resist for exposure to i-rays containing a quinone diazide compound as a photosensitizer and a novolak resin, had the absorbance of 0.8 to a KrF excimer laser beam having the wave length of 248 nm. (This value is equivalent to the absorbance of 2.0 per 1 μm in thickness of the resist film.) As another example, a 0.7 μm-thick resist film obtained from a chemically amplified positive resist comprising poly(p-vinylphenol) as the resin and exposed to a KrF excimer laser beam had the absorbance of 2.5 to an ArF excimer laser beam having the wave length of 193 nm. (This value is equivalent to the absorbance of 3.6 per 1 μm in thickness of the resist film.)

In the process of exposing the whole surface to a light beam, the light exposure amount should be determined so as to cause substantially no film thickness reduction after development. The term "substantially no film thickness reduction after development" means that there is no significant difference between the film thickness of the pattern developed after the exposure of the whole surface and the film thickness of the pattern developed without the exposure of the whole surface, and that the shape of the former is equivalent to or better than that of the latter. In the case of the quinone diazide-type positive resist, it is preferable that the difference in film thickness is not greater than 10 Å. In the case of the chemically amplified positive resist, on the other hand, since the difference in film thickness as large as 150 Å hardly deteriorates the performance, it is preferable that the difference in film thickness is not greater than 200 Å in general and not greater than 50 Å in some cases. In the process of exposing the whole surface to a light beam, the light exposure amount is also determined to ensure a level that practically interferes with the phenomenon of forming the surface inhibition layer. The adequate light exposure amount is varied according to the type of the positive resist and the conditions of irradiation for patterning and it can be determined by a simple preliminary experiment.

The effects of the present invention can be attained when the irradiation for patterning and the exposure of the whole surface are carried out either in this order or in the reversed order.

When the post-exposure bake is conducted, it is generally conducted after the irradiation for patterning or after both the irradiation for patterning and the exposure of the whole surface. When the quinone diazide-type resist is used, (1) the irradiation for patterning, (2) the exposure of the whole surface and (3) the post-exposure bake may be conducted in any of the following order (1)→(2)→(3), (2)→(1)→(3) or (1)→(3)→(2), although order of (1)→(2)→(3) or (2)→(1)→(3) is preferred.

When the Chemically amplified resist is used, the order is preferably (1)→(3)→(2).

After the irradiation for patterning and the exposure of the whole surface are completed, development is carried out according to a known process to give a positive pattern. An alkaline aqueous solution is generally used for the development. Examples of the available developer include an aqueous solution of tetramethylammonium hydroxide and an aqueous solution of 2-hydroxyethyltrimethylammonium hydroxide.

EXAMPLES

The present invention is described more concretely referring to the following examples, although the present invention is not restricted to these examples. In the description below, % and parts represent % by weight and parts by weight, respectively, unless otherwise specified.

Example 1

A positive resist for exposure to i-rays containing a quinone diazide compound as a photosensitizer and a novolak resin ("Sumi-Resist PF1-38" manufactured by SUMITOMO CHEMICAL CO., LTD.) was coated in the thickness of 0.75 μm on a silicon wafer. A pre-bake was carried out on a direct hot plate at 90° C. for 60 seconds. The wafer with the resist film was then exposed to an i-ray stepper ("NSR2005i9C" manufactured by NIKON CORP., NA=0.57, σ=0.60) to form a line and space pattern. The whole surface of the resist film was then exposed to a KrF excimer laser beam (248 nm) emitted by a KrF excimer stepper ('NSR1755EX8A' manufactured by NIKON CORP.) with the light exposure amount specified in Table 1. After a post-exposure bake was carried out on a proximity hot plate at 110° C. for 60 seconds, a 60-second paddle development was carried out with a 2.38% aqueous solution of tetramethylammonium hydroxide.

The wafer after development was observed with a scanning electron microscope and evaluated for the resolution and profile. The resolution was expressed by the minimum size of the line and space pattern, which is separated without film thickness reduction at the light exposure amount to realize the ratio of 1:1 in a 0.40 μm line and space pattern (light exposure amount for patterning shown in Table 1). The profile was defined by the shape of the cross section of the 0.40 μm line and space pattern with the same light exposure amount. The film thickness of the pattern developed after the exposure of the whole surface and the same of the pattern developed without the exposure of the whole surface were measured with an optical gauge ("Lambda A" manufactured by DAINIPPON SCREEN MFG. CO., LTD.), and the difference in film thickness was given as an amount of film thickness reduction. The results of the measurement are shown in Table 1.

TABLE 1

| Run No. | Light exposure for patterning | Light exposure for exposing the whole surface | Resolution | Profile | Amount of film thickness reduction |
|---|---|---|---|---|---|
| 1 | 280 msec | 5 mJ/cm2 | 0.30 μm | Rectangular | <10Å |
| 2 | 270 msec | 10 mJ/cm2 | 0.30 μm | Rectangular | <10Å |
| 3 | 280 msec | Not carried out | 0.34 μm | Rectangular | — |
| 4 | 260 msec | 25 mJ/cm2 | 0.30 μm | With rounded corners | 15Å |
| 5 | 260 msec | 50 mJ/cm2 | 0.30 μm | Arch-shaped | 60Å |

As shown in Table 1, the resist patterns developed after the exposure of the whole surface to an extent that caused substantially no film thickness reduction after development (Run No. 1 and No. 2) had the rectangular profile and improved resolution.

Example 2
(1) Preparation of Resist

A Chemically amplified positive resist was prepared by dissolving a mixture of 13.5 parts of poly(p-vinylphenol) in which 33% of the hydroxide groups were tert-butoxycarbonyl methyl etherified as a resin, 1.0 part of N-(10-camporsulfonyloxy)succinimide as an acid precursor, 0.27 parts of 2-hydroxycarbazole as a sensitizer, and 0.054 parts of p-isopopylaniline as an additive in a solvent consisting of 52.8 parts of propylene glycol monomethyl ether acetate and 13.2 parts of ethyl lactate.

(2) Formation of Resist Film and its Evaluation

The Chemically amplified positive resist was coated in the thickness of 0.70 μm on a silicon wafer. A pre-bake was carried out on a direct hot plate at 90° C. for 60 seconds. The wafer with the resist film was then exposed to a KrF excimer stepper ('NSR1755EX8A' manufactured by NIKON CORP.) to form a line and space pattern. After each holding time period specified in Table 2, a post-exposure bake was carried out on a direct hot plate at 100° C. for 60 seconds. Immediately after the post-exposure bake, the whole surface of the resist film was exposed to a radiation of a 500 W far ultraviolet (deep UV) lamp (manufactured by USHIO INC.), which previously passed through an filter having the central wave length of 227.5 nm and the half width of 16.1 nm. Immediately after the exposure of the whole surface, a 60-second paddle development was carried out in a 2.38% aqueous solution of tetramethylammonium hydroxide.

The wafer after development was observed with a scanning electron microscope and evaluated for the resolution and profile. The resolution was expressed by the minimum size of the line and space pattern, which is separated without causing film thickness reduction with the light exposure to realize the ratio of 1:1 in a 0.40 μm line and space pattern (light exposure for patterning shown in Table 2). The profile was defined by the shape of the cross section of the 0.40 μm line and space pattern with the same light exposure and evaluated by the following three grades:

⊙: Substantially no T-shaped profile
o: Inconspicuous T-shaped profile
x: Obvious T-shaped profile The film thickness of the pattern developed after the exposure of the whole surface and the same of the pattern developed without the exposure of the whole surface were measured in the same manner as Example 1, and the difference in film thickness was given as an amount of film thickness reduction. The results of the measurement are shown in Table 2.

TABLE 2

| Run No. | Light exposure for patterning | Holding time period | Light exposure for exposing the whole surface | Resolution | Profile | Amount of film thickness reduction |
|---|---|---|---|---|---|---|
| 6 | 155 mJ/cm2 | 0 minute | 5 seconds | 0.27 μm | ⊙ | <10Å |
| 7 | " | 10 minutes | 5 seconds | 0.28 μm | ⊙ | <10Å |
| 8 | " | 10 minutes | 15 seconds | 0.27 μm | ⊙ | <10Å |
| 9 | " | 25 minutes | 15 seconds | 0.30 μm | ○ | <10Å |
| 10 | 155 mJ/cm2 | 0 minutes | Not carried out | 0.27 μm | ○ | — |
| 11 | 170 mJ/cm2 | 10 minutes | Not carried out | 0.39 μm | X | — |
| 12 | 200 mJ/cm2 | 25 minutes | Not carried out | <3 μm | * | |

*In Run No. 12, the time delay effect caused no resolution of a 3 μm line and space pattern even at the light exposure amount of 200 mJ/cm2.

As shown in Table 2, the resist patterns developed after the exposure of the whole surface (Run Nos. 6 to 9) had the desirable profile and showed less deterioration of the resolution even with the holding time period of 25 minutes after the exposure for patterning.

Example 3
(1) Preparation of Resist A

A Chemically amplified positive resist was prepared by dissolving a mixture of 13.5 parts of poly(p-vinylphenol) in which 33% of the hydroxide groups were tert-butoxycarbonyl methyl etherified as a resin, 1.0 part of N-(10-camphorsulfonyloxy)succinimide as an acid precursor, 0.27 parts of 2-hydroxycarbazole as a sensitizer, and 0.02 parts of 2,6-diisopopylaniline as an additive in a solvent consisting of 52.8 parts of propylene glycol monomethyl ether acetate and 13.2 parts of ethyl lactate. This is hereinafter referred to as the resist A.

(2) Preparation of Resist B

A Chemically amplified positive resist was prepared by dissolving a mixture of 13.5 parts of poly(p-vinylphenol) in which 40% of the hydroxide groups were tert-butoxycarbonylated as a resin, 1.0 part of N-(10-camphorsulfonyloxy)succinimide as an acid precursor, 0.27 parts of 2-hydroxycarbazole as a sensitizer, and 0.02 parts of 2,6-diisopopylaniline as an additive in a solvent consisting of 43.7 parts of 2-heptanone and 2.3 parts of γ-butyrolactone. This is hereinafter referred to as the resist B.

(3) Formation of Resist Film and its Evaluation

The resist A and the resist B prepared as above were respectively coated in the thickness of 0.72 μm on a silicon wafer. A pre-bake was carried out on a direct hot plate at 90° C. for 60 seconds. The wafer with the resist film was then exposed to a KrF excimer stepper ('NSR1755EX8A' manufactured by NIKON CORP.) to form a line and space pattern. After each holding time period specified in Table 3, a post-exposure bake was carried out on a direct hot plate at 100° C. for 60 seconds. Immediately after the post-exposure bake, the whole surface of the resist film was exposed to a radiation of a 172 nm Xe2 excimer lamp ('UER 20-172' manufactured by USHIO INC.) or a 222 nm KrCl excimer lamp ('UER 20-222' manufactured by USHIO INC.) Immediately after the exposure of the whole surface, a 60-second paddle development was carried out in a 2.38% aqueous solution of tetramethylammonium hydroxide.

The wafer after development was observed with a scanning electron microscope and evaluated for the resolution and profile. The resolution was expressed by the minimum size of the line and space pattern, which is separated without causing film thickness reduction with the light exposure amount to realize the ratio of 1:1 in a 0.35 µm line and space pattern (light exposure for patterning shown in Table 3). The profile was defined by the shape of the cross section of the 0.35 µm line and space pattern with the same light exposure and evaluated using the same criteria as Example 2. The film thickness of the pattern developed after the exposure of the whole surface and the same of the pattern developed without the exposure of the whole surface were measured in the same manner as Example 1, and the difference in film thickness was given as an amount of film thickness reduction. The results of the measurement are shown in Table 3.

C. for 60 seconds, a 60-second paddle development was carried out in a 2.38% aqueous solution of tetramethylammonium hydroxide.

The wafer after development was observed with a scanning electron microscope and evaluated for the resolution and profile. The resolution was expressed by the minimum size of the line and space pattern, which is separated without causing film thickness reduction with the light exposure amount to realize the ratio of 1:1 in a 0.35 µm line and space pattern (light exposure amount for patterning shown in Table 4). The profile was defined by the shape of the cross section of the 0.35 µm line and space pattern with the same light exposure. The contact angle of the resist film after the exposure of the whole surface and the developer was also measured. The results of the measurement are shown in Table 4.

TABLE 4

| Run No. | Light exposure for patterning | Light exposure for exposing the whole surface | Resolution | Profile | Contact angle |
|---|---|---|---|---|---|
| 20 | 380 msec | 0.1 second | 0.29 µm | The same as the case without exposure of the whole surface | 51° |
| 21 | 380 msec | Not carried out | 0.29 µm | Rectangular | 57° |

TABLE 3

| Run No. | Resist | Light exposure for patterning | Holding time period | Exposure of the whole surface | | Resolution | Profile | Amount of film thickness reduction |
|---|---|---|---|---|---|---|---|---|
| | | | | Wave length | Light exposure | | | |
| 13 | A | 260 mJ/cm2 | 20 minutes | 172 nm | 0.1 second | 0.26 µm | ⊚ | <10Å |
| 14 | A | " | " | 222 nm | 5 seconds | 0.26 µm | ⊚ | <10Å |
| 15 | B | 244 mJ/cm2 | " | 172 nm | 0.1 second | 0.26 µm | ⊚ | <10Å |
| 16 | A | 260 mJ/cm2 | 0 minute | Not carried out | | 0.26 µm | ⊚ | — |
| 17 | B | " | " | " | | 0.26 µm | ⊚ | — |
| 18 | A | 244 mJ/cm2 | 20 minutes | " | | 0.31 µm | X | — |
| 19 | B | " | " | " | | 0.33 µm | X | — |

As shown in Table 3, the resist patterns developed after the exposure of the whole surface (Run Nos. 13 to 15) had the desirable profile and showed no deterioration of the resolution even with the holding time period of 20 minutes after the exposure for patterning.

Example 4

The positive resist for exposure to i-rays, "Sumi-Resist PF1-38", manufactured by SUMITOMO CHEMICAL CO., LTD. was coated in the thickness of 1.065 µm on a silicon wafer. A pre-bake was carried out on a direct hot plate at 90° C. for 60 seconds. The wafer with the resist film was then exposed to an i-ray stepper ("NSR2005i9C" manufactured by NIKON CORP., NA=0.57) to form a line and space pattern. The whole surface of the resist film was then exposed to a radiation of a 172 nm $Xe_2$ excimer lamp ('UER 20-172' manufactured by USHIO INC.) in order to decrease the illuminance, the wafer was 7.5 mm apart from the emission window of the excimer lamp. After a post-exposure bake was carried out on a direct hot plate at 110°

TABLE 4-continued

| Run No. | Light exposure for patterning | Light exposure for exposing the whole surface | Resolution | Profile | Contact angle |
|---|---|---|---|---|---|
| 22 | " | 0.4 second | 0.29 µm | With slightly rounded corners | 52° |

As shown in Table 4, the resist pattern developed after the exposure of the whole surface to an extent that caused substantially no film thickness reduction after development (Run No. 20) showed no deterioration of the resolution or profile, while decreasing the contact angle of the resist surface and the developer. This effectively reduces the defects of development due to micro-bubbles or the like.

Example 5

The resist A prepared in Example 3(1) was coated in the thickness of 0.96 μm on a silicon wafer. A pre-bake was carried out on a direct hot plate at 90° C. for 60 seconds. The wafer with the resist film was then exposed to an electron beam from an electron beam exposure device ('ELS-3300' manufactured by Elionics Corp.) to form a pattern of 80 μm×60 μm. The exposure amount of electron beam was varied stepwise at the acceleration voltage of 25 kV. After each holding time period specified in Table 5, a post-exposure bake was carried out on a direct hot plate at 100° C. for 90 seconds. Immediately after the post-exposure bake, the whole surface of the resist film was exposed to a radiation of a 172 nm Xe2 excimer lamp ('UER 20-172' manufactured by USHIO INC.) under the condition that the wafer was in intimate contact with the emission window. The illuminance of the lamp was 5 mW/cm2. Immediately after the exposure of the whole surface, a 60-second development was carried out in a 2.38% aqueous solution of tetramethylammonium hydroxide.

The wafer after development was observed with a scanning electron microscope, and the dose to clear (Eth) was determined. The film thickness of the pattern developed after the exposure of the whole surface and the same of the pattern developed without the exposure of the whole surface were measured in the same manner as Example 1, and the difference in film thickness was given as an amount of film thickness reduction. The results of the measurement are shown in Table 5.

TABLE 5

| Run No. | Holding time period | Light exposure of the whole surface | Dose to clear | Amount of film thickness reduction |
|---|---|---|---|---|
| 23 | 20 minutes | 0.1 second | 45 μC/cm2 | <10Å |
| 24 | 0 minute | Not carried out | 44 μC/cm2 | — |
| 25 | 20 minutes | Not carried out | 60 μC/cm2 | — |

As shown in Table 5, in case that the resist film is exposed to an electron beam for patterning, the exposure of the whole surface effectively lessens the deterioration of the sensitivity even with the long holding time period after the irradiation.

As discussed above, the method of the present invention depresses formation of a surface inhibition layer of the resist pattern and improves the affinity of the resist film for the developer, thereby reducing the defects of development due to micro-bubbles. The resist patterns provided by the method of the present invention accordingly have excellent performances.

What is claimed is:

1. A method of forming a positive resist pattern which comprises:

(A) forming a positive resist film on a substrate;

(B) irradiating the resist film with an active ray for patterning;

(C) exposing the whole surface of the resist film to a light beam with a predetermined light exposure amount that causes substantially no film thickness reduction after development said light beam causing an absorbance of 1.5 or greater per 1 μm in thickness of said resist film and being different from the active ray used in step (B); and (D) carrying out development after step (B) and (C) are conducted.

2. The method in accordance with claim 1, wherein said active ray used for patterning in step (B) is a light beam; and said light beam used in step (C) has a wave length that ensures a higher absorbance of said resist film than an absorbance of said resist film irradiated in step (B).

3. The method in accordance with claim 2, wherein said positive resist comprises a quinone diazide photosensitizer and an alkali-soluble resin.

4. The method in accordance with claim 1, wherein said positive resist comprises an alkali-soluble resin and an acid precursor.

5. The method in accordance with claim 1, wherein said active ray used for patterning is an electron beam or an X ray.

6. The method in accordance with claim 1, wherein the exposure of the whole surface is carried out after the irradiation with said active ray for patterning.

\* \* \* \* \*